United States Patent [19]

Muyshondt et al.

[11] Patent Number: 5,592,391
[45] Date of Patent: Jan. 7, 1997

[54] FARADAY CAGE FOR A PRINTED CIRCUIT CARD

[75] Inventors: Jorge E. Muyshondt, Austin; Gary A. Parker, Round Rock; Bruce J. Wilkie, Georgetown, all of Tex.

[73] Assignee: International Business Machines Corporation, Armonk, N.Y.

[21] Appl. No.: 485,704

[22] Filed: Jun. 7, 1995

Related U.S. Application Data

[63] Continuation of Ser. No. 26,888, Mar. 5, 1993, Pat. No. 5,475,606.

[51] Int. Cl.⁶ ...................................................... H05K 3/00
[52] U.S. Cl. ........................... 364/489; 174/260; 174/258; 174/35 R
[58] Field of Search .................................... 364/488, 489; 174/250, 258, 260, 35 R

[56] References Cited

U.S. PATENT DOCUMENTS

| | | | |
|---|---|---|---|
| 4,593,813 | 6/1986 | Powel | 206/708 |
| 5,006,788 | 4/1991 | Goulette et al. | 324/95 |
| 5,023,753 | 6/1991 | Abe | 361/782 |
| 5,025,116 | 6/1991 | Kawakami et al. | 174/250 |
| 5,030,800 | 6/1991 | Kawakami et al. | 174/264 |
| 5,165,055 | 11/1992 | Metsler | 333/12 |
| 5,247,735 | 9/1993 | Parry et al. | 29/847 |
| 5,262,594 | 11/1993 | Edwin et al. | 174/254 |
| 5,270,493 | 12/1993 | Inoue et al. | 174/253 |
| 5,278,720 | 1/1994 | Bird | 361/119 |

*Primary Examiner*—Vincent N. Trans
*Attorney, Agent, or Firm*—Jeffrey S. LaBaw

[57] ABSTRACT

In a printed circuit board having a plural number of conductor layers separated by a plural number of insulator layers, a Faraday cage is constructed including a first and a second ground plane disposed in a first and second conductor layer respectively. The ground planes being electrically interconnected at their peripheries, preferably by a plurality of vias. A third conductor layer is disposed between the first and second conductor layers in which a plurality of signal paths are defined. The Faraday cage surrounds a shielded portion of the third conductor layer so that electrical signals conducted through the shielded portion are isolated from electrical noise. The invention finds particular application in a mixed digital/analog board separated into a digital section of the board having a digital ground plane defined in one of the conductor layers and a plurality of digital signal paths defined in another of the conductor layers and an analog section of the board having the Faraday cage and the shielded portion. Thus, the plurality of signal paths in the shielded region are intended for analog signals which are sensitive to digital noise. Additional conductor layers in the analog section can be added inside and outside the Faraday cage. Those analog signal paths located outside the cage are defined for analog signals which are less sensitive than analog signals in the shielded region. The board may be an audio card for a digital computer.

8 Claims, 5 Drawing Sheets

5,592,391

FARADAY CAGE FOR A PRINTED CIRCUIT CARD

This application is a continuation of Ser. No. 08/026,888, filed Mar. 5, 1993, now U.S. Pat. No. 5,475,606.

BACKGROUND OF THE INVENTION

This invention relates to printed circuit boards. More particularly, it relates to a printed circuit board architecture for low noise operation for analog/digital circuits.

Printed circuit boards are typically wired so that ground signals share a common plane on one of the layers of the board. This technique works well for digital or analog circuit boards which employ the use of high speed or wide bandwidth signals. It provides for relatively good transmission line parameter characterization which affords better frequency response and minimizes transmission line reflections.

In a mixed analog/digital system, the resulting ground currents of the two disciplines are significantly different. The analog subsystem generally suffers from noise problems induced by the rapidly transitioning signals of the digital subsystem. Its noise floor is generally lower than what could be achieved using the same circuits completely isolated from the digital signals. One means to alleviate this problem is to segregate the signals and design the card so that the ground plane is divided into separate analog and digital ground planes. The technique substantially reduces the interaction of the ground currents, and a reduction of the noise crosstalk between the digital and analog sections. As shown in FIG. 1, the ground layer is separated into an analog and a digital ground plane.

This invention represents a further improvement in low noise operation of a printed circuit board, particularly in a mixed analog/digital system.

SUMMARY OF THE INVENTION

It is therefore an object of the invention to isolate noise sensitive signals from an electrically noisy environment.

This object and other objects, features and advantages of the invention are accomplished by a printed circuit board architecture having two ground planes which sandwich at least a third plane through which the most susceptible signals are transmitted; the two ground planes are interconnected at their periphery to form a Faraday cage.

In a printed circuit board having a plural number of conductor layers separated by a plural number of insulator layers, a Faraday cage is constructed including a first and a second ground plane disposed in a first and second conductor layer respectively. The ground planes are electrically interconnected at their peripheries, preferably by a plurality of vias. A third conductor layer is disposed between the first and second conductor layers in which a plurality of signal paths are defined. The Faraday cage surrounds a shielded portion of the third conductor layer so that electrical signals conducted through the shielded portion are isolated from electrical noise. The invention finds particular application in a mixed digital/analog board separated into a digital section of the board having a digital ground plane defined in one of the conductor layers and a plurality of digital signal paths defined in another of the conductor layers and an analog section of the board having the Faraday cage and the shielded portion. Thus, the plurality of signal paths in the shielded region are intended for analog signals which are sensitive to digital noise. Additional conductor layers in the analog section can be added inside and outside the Faraday cage. Those analog signal paths located outside the cage are defined for analog signals which are less sensitive than analog signals in the shielded region.

The board may be an audio card for a digital computer. Digital commands from the computer are converted to analog signals for a speaker coupled to the board. In one preferred embodiment, the digital section includes a bidirectional buffer which receives commands from a system bus of the computer and a digital signal processor which processes the commands into digital signals. The analog section includes a CODE C which converts the digital signals from the digital signal processor into analog signals.

BRIEF DESCRIPTION OF THE DRAWINGS

These and other objects, features and advantages will be more easily understood with reference to the following description and attached drawings.

DETAILED DESCRIPTION OF THE DRAWINGS

According to the present invention, to reduce noise levels in the analog section, it is necessary to isolate it from the digital section. Careful arrangement of the ground planes and placement of vias in the analog section of a printed circuit board (PCB) can be used to effectively build a Faraday cage around the analog signals and prevent digital noise from coupling into the analog section.

Figure 1:
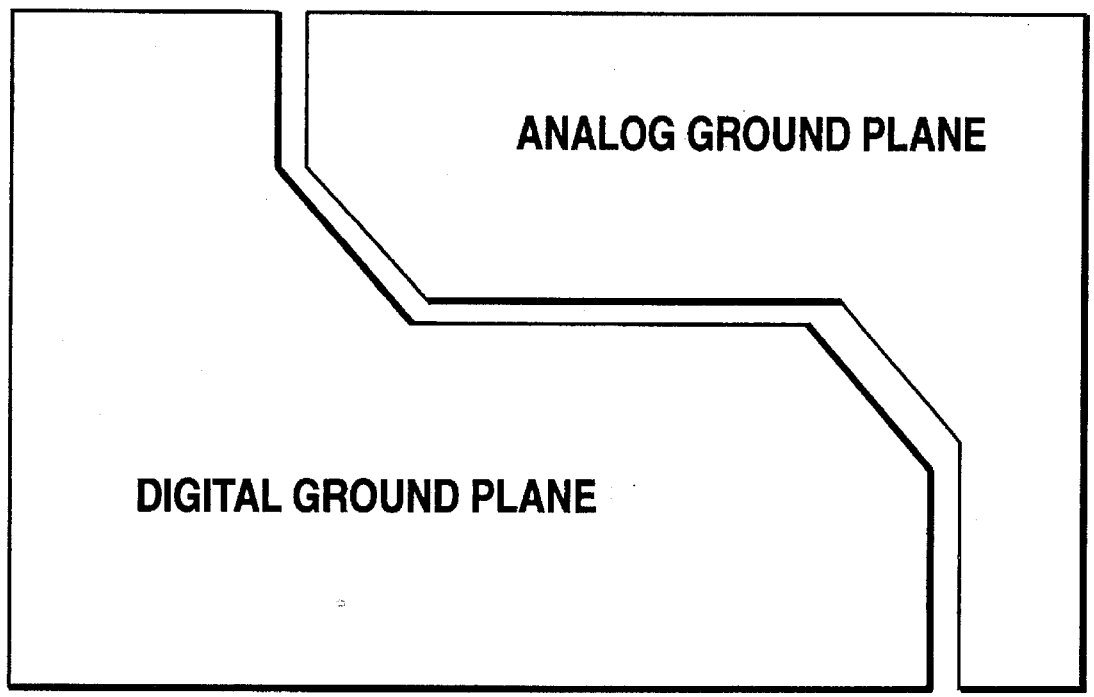
FIG. 1 is a diagram of a prior art circuit board having separate analog and digital ground planes.
Figure 2A:
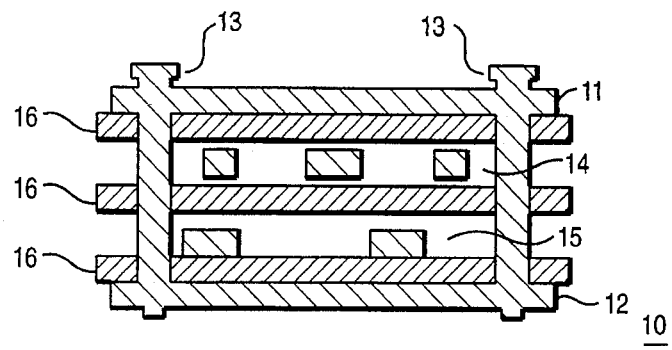
FIG. 2A is a crosssectional diagram of a printed circuit board having two outer analog power planes interconnected at the periphery by a plurality of vias to form a Faraday cage.

A Faraday cage which completely encloses a printed circuit board 10 is depicted in FIG. 2A. A first ground plane 11 is disposed on the board 10 and interconnected to the second ground plane 12 disposed on the bottom of the board 10 by a plurality of vias 13. The vias 13 are placed substantially uniformly around the periphery of the two ground planes 11, 12. The Faraday cage is composed of the two ground planes 11, 12 and the interconnecting vias 13 which effectively isolate the two sets of signal wires 14, 15 from outside interference. The conducting material of which the ground planes and signal wires are composed are separated by conventional insulation planes 16. If permitted by cost constraints, a third ground plane could be added between signal wires 14, 15 to from two Faraday cages which isolate the two sets of signal wires 14, 15 from mutual crosstalk. A Faraday cage is an enclosure which protects a shielded signal or device from electromagnetic or electrostatic disturbances. It is generally better to ground the Faraday cage to provide a means of draining extra charge.

Figure 2B:
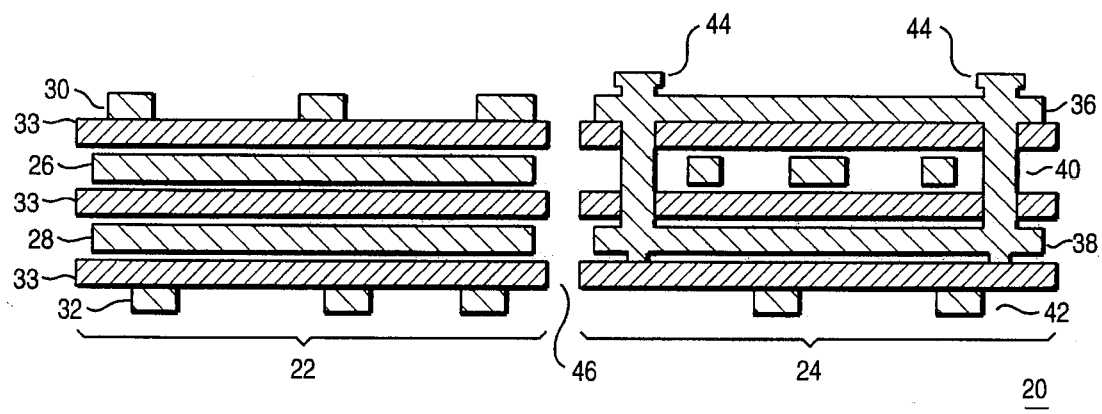
FIG. 2B is a crosssectional diagram of printed circuit board in which only the most sensitive of the analog signals are encased in the Faraday cage and one of the analog power planes has been located at an inner layer of the board.

The ground planes which make up the cage are the same composition as normal ground planes, e.g., copper. However, they differ from normal ground planes in that they are electrically connected together around their periphery. It is not required that the vias 13 merge to form a solid wall of material, but a structure must be formed to envelop the signals to be shielded. The ground planes should be as continuous as possible, i.e signal lines should not be run parallel to the ground planes that might cut the ground planes in small pieces. As shown in FIGS. 2A and 2B, there are no power planes in the shielded sections of the cards. The power signals are routed as individual signals as needed.

The higher the frequency that is to be locked by the Faraday cage the closer the vias need to be located. In a crude sense, the vias are acting as a fence to reduce the flow of signals through it. The magic number is to make the spacing equal to or less than ¼ wave length at the frequency of interest. In today's personal computers the highest frequencies which need to be dealt with are in the low gigahertz range. This necessitates a minimum spacing of approximately 0.375 inches or less. Where external interfaces are involved.

Figure 2C:
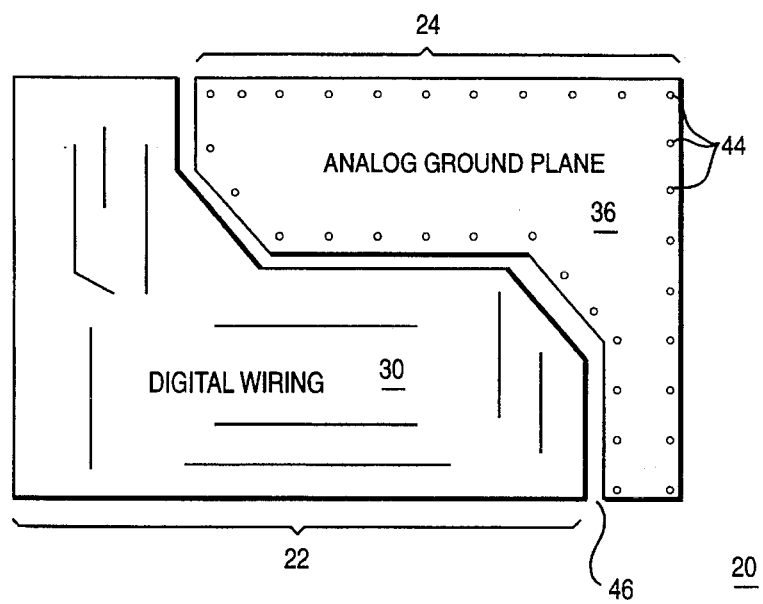
FIG. 2C is a top view of a printed circuit board according to the invention.

FIGS. 2B and 2C respectively show crosssectional and top views of another embodiment of the invention in which a Faraday cage is constructed around the most sensitive analog signals of a printed circuit board 20. The board 20 is comprised of a digital section 22 and an analog section 24. The digital section of the board is designed conventionally, having an inner digital power plane 26 and an inner digital ground plane 28. The digital signals are aggregated to digital signal planes 30, 32 on the top and bottom surfaces of the printed circuit board. Insulator layers 33 separate the conductor/layers.

Two ground planes 36, 38 are used in the analog section of the board. The two analog ground planes 36, 38 should be the same shape and size to avoid capacitive coupling with other signals in the board. These planes are used to sandwich a third conductor layer 40 where the more sensitive, low level analog signals and power connections are wired. The remaining less susceptible signal traces are located on another conductor layer 42, located outside the Faraday cage. The Faraday cage is comprised of the two ground planes 36, 38 and the connecting vias 44 placed around the periphery of the planes. In the preferred embodiment, no portion of the analog section is allowed to overlap any digital signals. Further, all analog signals are maintained within the area of the analog ground planes.

The second ground plane 38 as located in FIG. 2B is a compromise between function and cost. Ideally, a third ground plane would be placed outside of the last signal plane 42. The highly sensitive signals are contained within the two planes and the less susceptible signal lines are exposed. While this does introduce some level of exposure for those signals outside of the ground planes, it does insure that the highly sensitive signals are not exposed to cross coupling of other signal lines.

As mentioned above, the low level analog signals are the most susceptible to noise. By placing them between two ground planes and connecting these planes together in several places, the signals are effectively surrounded by a grounded enclosure that shields them from the digital noise. The present invention finds utility in an adapter card for a digital computer to produce an analog audio signal to a speaker system. In an audio application of analog signals, those which are most vulnerable to corruption are typically low level/high impedance signals. Low level signals would typically be defined as those ranging from approximately 1 Volt and below, microphone signals being typically from 6 mv to 60 mv. High impedance typically refers to average impedances of greater than 10K ohms. In the audio world, typical interconnection impedances range from 2K ohms, for low impedance microphones, to in excess of 100K ohms, with typical line connection is approximately 47K ohms. These signals are usually associated with pre-amplifiers used with microphones and with mixer designs. With the advent of lower operating voltages, many of the signals which are previously within the pre-amplifier domain are now the typical signal to achieve a full scale value at the A/D converter, while the audio card described below only requires a 1 volt signal to reach the same full scale value.

Other considerations which should be kept in mind when designing a card according to the principles of the present invention include keeping the interconnections between the digital section and the analog section of the design to a minimum. The interconnections are preferably concentrated in only one region of the layout. Due to the parasitic effects of the layout, the void between the analog and digital sections is kept as clear of signal lines as possible. This is to reduce the coupling of digital noise to the analog ground system. Typically, the gap 46 between the analog and digital sections of the board is maintained at approximately 0.1 inches.

The invention provides significant reduction in digital noise from the prior art The typical noise floor of personal computer is characterized in the −40 db to −45 db range. Using the prior art solid ground plane approach, connected to the personal computer ground at a single point, with both digital and analog signals applied, results in a typical noise floor of approximately −45 db to −55 db. About a 0 db to 15 db improvement. Using a split ground system, with the digital and analog grounds connecting to the computer ground system at a single point, the resulting noise floor is typically −55 db to −85 db. About 15 db to 45 db improvement. Using the shielded cage approach of the present invention combined with the split grounds, still connecting to the computer ground at a single point, test data indicates a noise floor of greater than −100 db, an improvement of 55 db to 60 db over the system noise floor.

The invention does not require any special processing steps; conventional card manufacturing techniques may be used. Primarily, it is the pattern of the two or more ground planes with interconnecting vias which distinguish the process of the current invention. One process for fabricating a board according to the invention is described below in connection with FIG. 3.

Figure 3A:
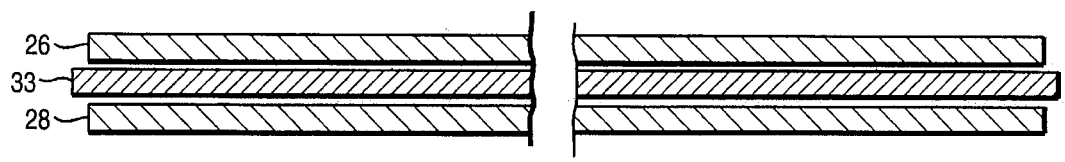
FIGS. 3A–3D depict a process for manufacturing the printed circuit board of the present invention.
Figure 3B:
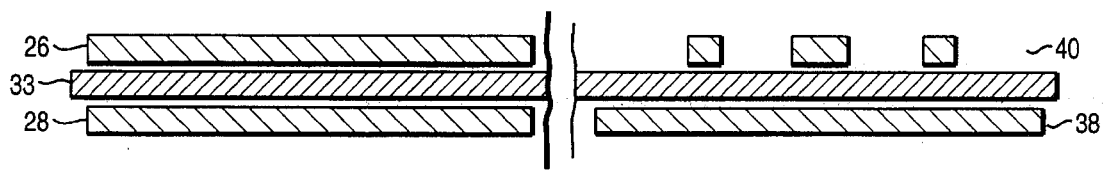

The panel manufacturing process begins by selecting a sheet of prepreg. Prepreg. is a plastic material that is used as a base from which the printed circuit board core can be started. A 1 oz copper foil is applied to each side of the prepreg using a specialized epoxy. This assembly, now called the core, is pressed to a thickness of 0.024" and baked at 120° C. The core at this point is in process as shown in FIG. 3A. Next, the core is put through a standard photo etch process twice. The first exposes and etches the layer two artwork to one side of the core, crating the analog signal traces that will need to be protected. The second pass exposes the other side of the core to the layer three artwork to create the analog ground plane that will serve as the underside plate of the Faraday cage. The core at this point in the process is shown in FIG. 3B.

Figure 3C:
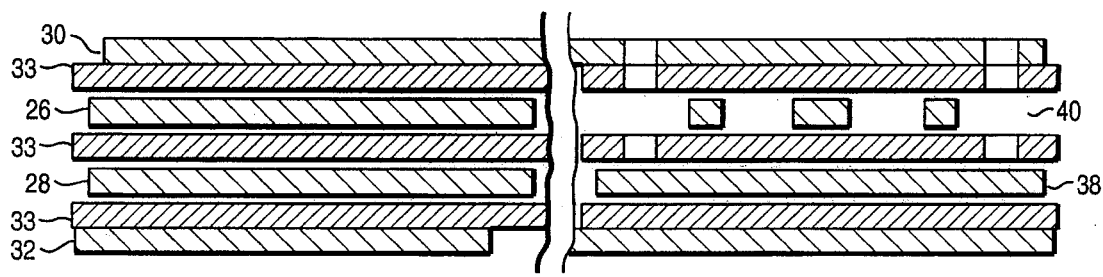
Figure 3D:
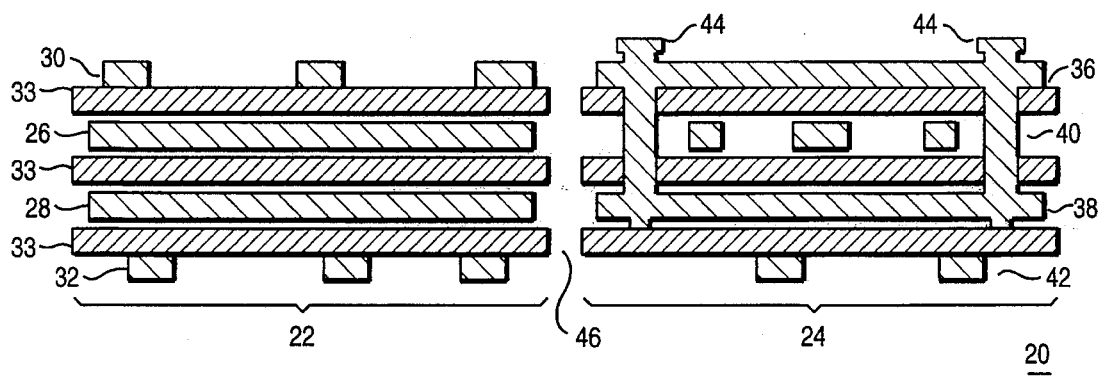

With both sides of the core fully etched and tested, the exterior copper can now be applied. A 0.0172" coating of standard fiberglass and specialized epoxy is applied to each side of the core followed by 0.5 oz copper foil. This assembly, now called a panel, is one again baked at 120° C. The panel assembly is overall thickness of 0.060". Next, the panel goes to the drill process where all interconnect holes or vias are put into the card. The panel at this point is shown in FIG. 3C. After the drill process, the panel moves to the plating process where a 0.001" layer of copper is applied to the panel. This creates the physical electrical connection through the interconnect vias that connect the Faraday cage plates. Next, the panel returns to the standard etch process where the top of the panel is exposed to the layer one artwork. This creates the top plate of the Faraday cage along with the component foot prints. At this state we have now completely surrounded the layer two signal lines with the Faraday cage. The layer one plate connects directly to the layer three plate through interconnect holes (now known as vias), thus sandwiching the layer two signals between them. Additionally, the bottom of the panel receives the layer four artwork therefore completing the signal trace generation. This stage is shown in FIG. 3D. This stage is shown in FIG. 3D. The panel will now receive soldermask and have end user text known as white ID placed on them. The panel is moved to the ECAT assembly process.

The Electronic Card Assembly and Test (ECAT) process begins by applying a thin layer of solder paste to the foot prints of the components. Solder paste is a mixture of very tiny balls of solder in a very thick jell of flux. When enough heat is applied, the solder balls melt and will attach the pin of a component to the copper pad of the board. This provides the electrical connection between the board and the required XXX chips mounted thereon. After the solder paste is applied, the components are placed on top of the paste and the assembly is placed in an oven that will attach the components through means of the description above. Additionally, components that could not withstand the heat of the oven are now placed on the card by hand and soldered into place.

Figure 4:
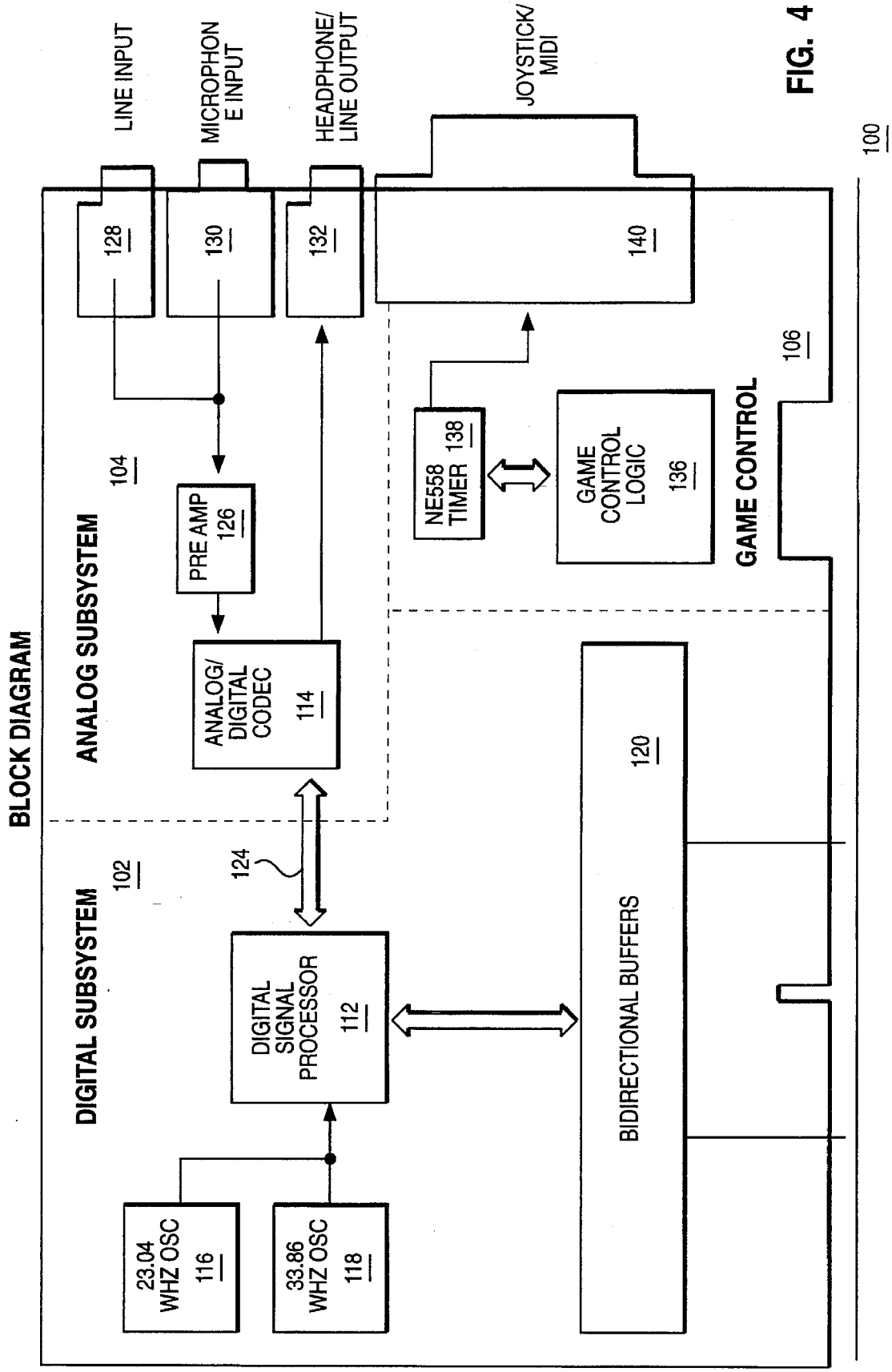
FIG. 4 is a layout of a particular multimedia card containing both analog and digital circuitry built according to the present invention.

A more specific audio card which uses the present invention, is discussed below in connection with FIG. 4. Those skilled int he art would recognize that the described audio card is merely illustrative and that a great many other cards could benefit from the principles taught by the present invention.

The audio control card 100 is an audio subsystem that provides basic audio function to computers made by the IBM Corporation and other compatible personal computers. Those skilled in the art would understand that adapter cards for other computers made by other vendors can be designed according to the principles of the present invention. Among other functions, subsystem gives the user the capability to record and play back audio signals. The adapter card 100 can be divided into three main sections: DSP Subsystem 102, Analog Subsystem 104 and Game Control 106. The DSP subsystem 102 and Game Control 106 make up the digital section 108 of the card 100. The rest of the components make up the analog section 110. Mounted on the adapter card 100 is a digital signal processor (DSP) 112 and an analog coding/decoding (CODEC) chip 114 that converts signals between the digital and analog domains. The adapter card 100 also has logic to control a game port to allow connection of a joystick.

The DSP Subsystem portion 102 of the card handles all communications with the host computer (not pictured). All bus interfacing is handled within the DSP 112 itself. The DSP 112 uses two oscillators 116, 118 as its clock sources.

The oscillators 116, 118 are not connected to other devices. The DSP 112 also needs a set of external buffers 120 to provide enough current to drive the host computer bus. The bi-directional buffers 120 redrive the signals used to communicate with the host computer bus. These devices are typically 74LS244 or 74LS245 TTL drivers. The DSP 102 controls the CODEC 114 via a serial communications link 124. This link 124 consists of four lines: Serial Data, Serial Clock, CODEC Clock and Frame Synchronization Clock. These are the only digital signals that enter the analog section 104 of the card.

The analog subsystem 104 is made up of the CODEc 114 (a Crystal Semiconductor CS4215 16-bit stereo CODEC) and a pre-amplifier 126 built around a TL084 op-amp. The CODEC 114 handles all the Analog-to-Digital (A/D) and Digital-to-Analog (D/A) conversions by communicating with the DSP 112 to transfer data to and from the host computer. The DSP 112 may transform the data before passing it on to the host.

Analog signals come from the outside world through the Line Input 128 and Microphone Input 130 jacks. The signals are fed into the pre-amplifier 126 built around a single operational amplifier. The amplifier 126 conditions the input signal levels before they connect to the CODEC 114. Typical line level signals are around 1 Vrms. Typical microphone signals are around 15 mVrms. The typical frequency range is from 20 Hz to 20 kHz. Analog signals from the computer are connected to the outside world, e.g., speakers or headphones, through the Headphone/Line Out jack 132. It is capable of driving a stereo headset as well as other devices that use line level signals. The frequency range is from 20 Hz to 20 kHz with a maximum level of 4 V p-p.

The game control function is functionally separate from the rest of the card and is separate coupled to the system bus of the computer, but is made up of digital components and so resides on the digital section of the card. There are two Programmable Array Logic (PAL) devices 136 (one pictured) that interface with the host system bus. They decode the specific game control address range and fire the NE558 timer 138 as required. This timer 138 has four inputs that are fired to an active high level. They remain in that state for a period proportional to the resistance connected to the Joystick/MIDI connector 140. This connector is a 15-pin D-shell connector. Typically, a joystick is connected here. A joystick is made up of two variable resistors that are connected to the inputs of the NE558 timer. There are no high frequency signals used in these card inputs. The PAL devices are a Texas Instruments TIBPAL-20L8 and TIBAPL-16L8.

There are two signals that go from the DSP chip through an open collector buffer (such as a 74LS07) to the Joystick/MIDI connector. These are the MIDI IN and MIDI OUT lines. These signals could be conditioned externally to connect to musical instruments to control their operation. MIDI stands for Musical Instrument Digital Interface. It is an synchronous 31.25 kb serial data link.

Due to the processes (CMOS) used today for the mixed signal devices, e.g., the Crystal CS-4215 CODEC chip, the susceptible bandwidth has become significantly greater than in previous designs. While the audio spectrum of interest ranges from 20 Hz to 20 KHz, the operational bandwidth of the internal amplifiers is likely to be in the range of 10 Hz to 25 MHz. While this added bandwidth is of no real value to the audio application, it presents a real exposure for noise, and as such even though it is outside of the audible spectrum distortions can be introduced which affect signals within the audible range. As a result, care must be taken to consider careful noise reduction techniques throughout the spectrum capability of the components, and not limit it to the spectrum of the application.

An adapter card as described above is generally used in combination with a digital computer, such as a personal computer compatible with those manufactured by the International Business Machines Corporation. In addition to the digital noise on a mixed digital/analog adapter card, the analog signals also suffer from other noise sources located elsewhere in the computer.

For the purposes of an audio discussion is any signal which when added to the desired waveform are considered undesirable can be defined as noise. The sources of electrical noise within the personal computer are too numerous to list separately, however, Some prime offenders include clock sources, motors, power supplies and display systems.

The digital computer is based on the ability to move information in the form of binary ones and zeros, which are typically represented by the presence or absence of a current or voltage on any given signal. Without going into the details of computer design, this translates to the ability to assume a stable binary state for a specified time, then assume the next and so on in a timely fashion. The process of switching currents from one binary state to another crates disturbances in the power and signal distribution systems. These transients, since they are dynamic in frequency and level, assume the properties of noise to the analog design. Additionally, as the speed of the computer is increased these transients contain spectral components well up into the radio frequency range. As such the additional considerations of radiated energy coupling become as significant as direct coupled.

A discussion of a personal computer architecture in which the adapter card of the present invention may be operated follows.

Figure 5:
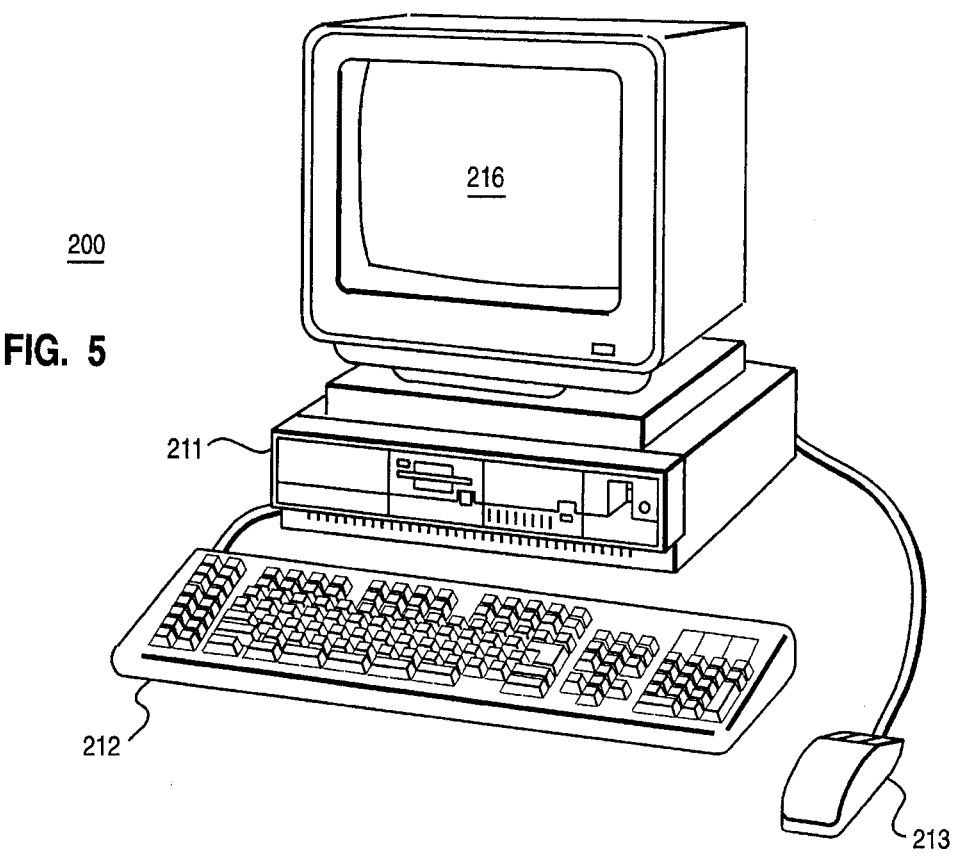
FIG. 5 is a personal computer in which cards built according to the present invention may be utilized.

FIG. 5, a personal computer 200, comprising a system unit 211, a keyboard 212, a mouse 213 and a display 214 are depicted.

Figure 6:
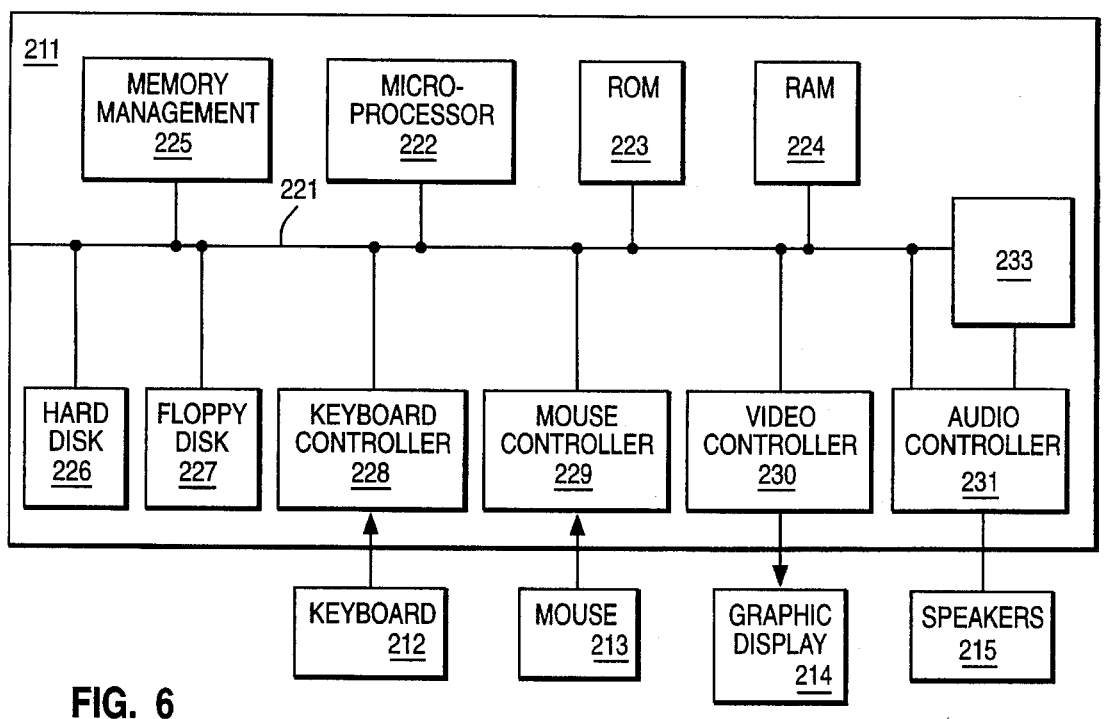
FIG. 6 is a block diagram of the computer depicted in FIG. 5.

FIG. 6 shows a block diagram of the components of the multimedia personal computer shown in FIG. 5. The system unit 211 includes a system bus to which various components are coupled and by which communication between the various components is accomplished. A microprocessor 222 is connected to the system bus 221 and is supported by read only memory (ROM) 223 and random access memory (RAM) 224 also connected to system bus 221. A microprocessor in the IBM multimedia PS/2 series of computers is one of the Intel family of microprocessors including the 8088, 286, 386 or 486 microprocessors, however, other microprocessors included, but not limited to Motorola's family of microprocessors such as the 68000, 68020 or the 68030 microprocessors and various Reduced Instruction Set Computer (RISC) microprocessors manufactured by IBM, Hewlett Packard, Sun, Intel, Motorola and others may be used int he specific computer.

The ROM 223 contains among other code the Basic Input/Output System (BIOS) which controls basic hardware operations such as the interaction and the disk drives and the keyboard. The RAM 224 is the main memory into which the operating system and multimedia application programs are loaded. The memory management chip 225 is connected to the system bus 221 and controls direct memory access operations including passing data between the RAM 224 and hard disk drive 221 and floppy disk drive 227. A CD ROM 228 also coupled to the system bus 221 is used to store the large amount of data present in a multimedia program or presentation.

Also connected to this system bus 221 are various I/O controllers: The keyboard controller 228, the mouse controller 229, the video controller 230, and the audio controller 231. As might be expected, the keyboard controller 228 provides the hardware interface for the keyboard 212, the mouse controller 229 provides the hardware interface for mouse 213, the video controller 330 is the hardware interface for the display 214, and the audio controller 331 is the hardware interface for the speakers 215a and 215b. Lastly, to the digital signal processor 233 incorporated into the audio controller card 231.

Digital audio commands from the host computer 200 are passed to the audio controller card 231 via the system bus 221. They are received by bidirectional buffers which are interrogated by the DSP 233. The DSP 233 transforms the audio data if appropriate and sends it to the CODEC. The serial communication link which connects the DSP and the CODEC is the bridge between the digital world of the computer and the analog section of the card which is protected by the Faraday cage. The CODEC will convert the digital signals to analog signals and send the analog signals to the head phone/line out jack to the speakers 215 to produce the analog sound corresponding to the original digital command from the computer.

Analog signals from a 1 player or microphone come into the system via the line input or microphone input jacks respectively. After being conditioned by the preamplifier, the analog signals are sent to the CODEC which converts them to digital signals which can be understood by the DSP. The digital signals are sent via the serial communications link to the DSP. The DSP may transform the data before passing it to the bidirectional buffers for reception by the host computer via the system bus.

While the invention has been described with respect to particular embodiments above, it will be understood by those skilled in the art that modifications may be made without departing from the spirit and scope of the present invention. The signal lines contained within the shielded region of the card need not be limited to only analog signals. There are cases where digital signals may be plaed in this kind of environment to reduce the effects of crosstalk and to apply shielded transmission line properties to that signal line. In this application we are only interested in analog, but in the broadest sense it can be applied to any signals which are susceptible to external interference, analog or digital. These embodiments are for purposes of example and illustration only and are not to be taken to limit the scope of the invention narrower than the scope of the appended claims.

We claim:

1. A printed circuit board having a plural number of conductor layers separated by a plural number of insulator layers comprising:

a first section of the board including a first and a second ground plane disposed in a first and second conductor layer respectively, the ground planes being electrically interconnected at selected peripheral regions forming a Faraday cage, wherein the Faraday cage is formed entirely within the printed circuit board and a third conductor layer disposed between the first and second ground planes in which a first plurality of signal paths for a first type of active device are defined and are substantially surrounded by the Faraday cage, at least one first type of active device attached to the first section of the board; and a second section of the board separately grounded from the first section in which a second plurality of signal paths for a second type of active device are defined, at least one second type of active device attached to the second section of the board;

the first plurality of signal paths protected by the Faraday cage from signals on the second plurality of signal paths.

2. The board as recited in claim 1 wherein the ground planes in the Faraday cage are interconnected at selected peripheral regions by a plurality of vias which substantially encircle an area of the second section of the board.

3. The board as recited in claim 1 wherein the board further comprises a fourth conductor layer in the first section and outside the Faraday cage in which signal paths are defined for the first type of active device intended for signals which are less sensitive than signals which use the signal paths in the Faraday cage.

4. A method of operating a printed circuit board having a plural number of conductor layers separated by a plural number of insulator layers, comprising the steps of:

in a first section of the board, grounding a Faraday cage disposed entirely within the printed circuit board including a first and a second ground plane disposed in a first and second conductor layer respectively, the ground planes being electrically interconnected at selected peripheral regions by a plurality of vias;

transmitting electrical signals from a first type of active device through a plurality of signal paths in a third conductor layer disposed between the first and second ground planes and substantially surrounded by the Faraday cage, the electrical signals from the first type of active device sensitive to emissions created by signals from a second type of a second active device; and transmitting electrical signals from a second type of active device through a second, separately grounded section of the board;

wherein the electrical signals from the first type of active device are protected by the Faraday cage from the emissions created by the second type of electrical device.

5. The method as recited in claim 4 wherein the plurality of vias substantially encircle an area of the first section of the board.

6. The method as recited in claim 4 further comprising the step of transmitting electrical signals from the first type of active device in signal paths defined in a fourth conductor layer in the first section and outside the Faraday cage which are less sensitive to emissions than signals which use the signal paths in the Faraday cage.

7. A method of manufacturing a printed circuit board having a plural number of conductor layers separated by a plural number of insulator layers comprising:

in a first section of the board;

providing a first and a second ground plane in a first and second conductor layer respectively;

providing a first plurality of signal paths for a first type of active device in a third conductor layer disposed between the first and second conductor layers;

connecting the first and second ground planes at selected peripheral regions with plurality of conductive vias which substantially encircle an area of the first, so that a portion of the third conductor layer is shielded by a Faraday cage formed by the first and second ground plane and the plurality of conductive vias;

in a second section of the board:

providing a third ground plane in a fourth conductor layer, separately grounded from the first and second ground planes, providing a second plurality of signal paths for a second type of active device in a fifth conductor layer.

8. The method as recited in claim 7 further comprising the step of providing a third plurality of signal paths in sixth conductor layer in the first section outside the Faraday cage for signals of the first type of active device which are less sensitive than signals which use the signal paths in the Faraday cage.

* * * * *